(12) United States Patent
Cheng et al.

(10) Patent No.: US 11,567,112 B2
(45) Date of Patent: Jan. 31, 2023

(54) PHASE-LOSS DETECTION APPARATUS OF THREE-PHASE AC POWER SOURCE AND METHOD OF DETECTING PHASE LOSS

(71) Applicant: DELTA ELECTRONICS, INC., Taoyuan (TW)

(72) Inventors: Lon-Jay Cheng, Taoyuan (TW); Shao-Chuan Chien, Taoyuan (TW); Shu-Hung Liao, Taoyuan (TW); I-Hsuan Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 42 days.

(21) Appl. No.: 17/357,627

(22) Filed: Jun. 24, 2021

(65) Prior Publication Data
US 2022/0291264 A1    Sep. 15, 2022

(30) Foreign Application Priority Data

Mar. 11, 2021 (CN) .......................... 202110266261.8

(51) Int. Cl.
*G01R 25/00* (2006.01)
*G01R 19/00* (2006.01)
(Continued)

(52) U.S. Cl.
CPC ......... *G01R 25/00* (2013.01); *G01R 19/0084* (2013.01); *H03K 19/21* (2013.01); *H03K 3/0377* (2013.01)

(58) Field of Classification Search
CPC .... G01R 25/00; G01R 19/00; G01R 19/0084; G01R 19/0092; H03K 19/00; H03K 19/20;
(Continued)

(56) References Cited

U.S. PATENT DOCUMENTS 4,630,042 A  * 12/1986 Kawasaki ............... G07F 9/002
                                                         340/10.41
2006/0187683 A1    8/2006 Hsieh et al.
(Continued)

FOREIGN PATENT DOCUMENTS

CN        1823276 A     8/2006
CN      105929257 A     9/2016
(Continued)

*Primary Examiner* — Hoai-An D. Nguyen
(74) *Attorney, Agent, or Firm* — Muncy, Geissler, Olds & Lowe, P.C.

(57) ABSTRACT

A method of detecting phase loss of a three-phase AC power source includes steps of: acquiring any two line voltages of the AC power source with a first cycle period, acquiring a first digital signal and a second digital signal, performing an exclusive OR operation between the first digital signal and the second digital signal to generate a level signal, accumulating a high-level time count value, or accumulating a low-level time count value, resetting the low-level time count value when the high-level time count value is accumulated, or resetting the high-level time count value when the low-level time count value is accumulated, and determining that the AC power source occurs a phase-loss abnormality when the high-level time count value is greater than or equal to ⅓ of the first cycle period or the low-level time count value is greater than or equal to ⅙ of the first cycle period.

11 Claims, 12 Drawing Sheets

(51) Int. Cl.
*H03K 19/21* (2006.01)
*H03K 3/037* (2006.01)

(58) Field of Classification Search
CPC ............ H03K 19/21; H03K 3/00; H03K 3/02;
H03K 3/027; H03K 3/037; H03K 3/0377
USPC ....... 324/76.11, 76.77, 76.82, 86; 702/1, 57,
702/66, 71, 72
See application file for complete search history.

(56) References Cited

U.S. PATENT DOCUMENTS

2016/0285381 A1*  9/2016  Lai ........................ G01R 31/42
2020/0287539 A1   9/2020  Ma et al.

FOREIGN PATENT DOCUMENTS

| CN | 106771681 A | | 5/2017 | |
|---|---|---|---|---|
| JP | 2004056893 A | * | 2/2004 | |
| JP | 2004135392 A | * | 4/2004 | ............ G01R 29/18 |
| JP | 2005245072 A | * | 9/2005 | ............ G05F 1/10 |
| JP | 2007017187 A | * | 1/2007 | ............ G01R 29/18 |
| JP | 2007025740 A | * | 2/2007 | ............ G05F 1/10 |
| KR | 100576187 B1 | * | 5/2006 | ............ H03K 19/20 |
| KR | 20110032934 A | * | 3/2011 | ............ G01R 25/04 |
| TW | 200630617 A | | 9/2006 | |
| WO | WO-2005036710 A1 | * | 4/2005 | ............ H02H 3/253 |

* cited by examiner

PHASE-LOSS DETECTION APPARATUS OF THREE-PHASE AC POWER SOURCE AND METHOD OF DETECTING PHASE LOSS

BACKGROUND

Technical Field

The present disclosure relates to a power abnormality detection apparatus and a method of detecting the power abnormality, and more particularly to a phase-loss detection apparatus of a three-phase AC power source and a method of detecting phase loss.

Description of Related Art

The statements in this section merely provide background information related to the present disclosure and do not necessarily constitute prior art.

The inverter usually uses a three-phase AC voltage as the input power source. When any one phase of the three-phase voltage circuit breaks fault, the input power source will be phase-loss as shown in FIG. 1. Since the source voltage obtained by full-wave rectification when the input power is phase-loss will significantly oscillate, thereby causing the DC bus voltage to oscillate, which is not conducive to the motor drive control.

The conventional level type of phase-loss detection structure is shown in FIG. 2. A three-phase AC input voltage sensor is installed to read the voltage values of the three-phase (for example, A-B-C or R-S-T) input voltage, and use the sensed three-phase voltages to determine whether the input voltage source is abnormal or not. As shown in FIG. 3, a high voltage level $V_H$ and a low voltage level $V_L$ are predetermined, and the sensed voltage information is compared with the high voltage level $V_H$ and the low voltage level $V_L$. If the voltage information is less than the low voltage level $V_L$ or greater than the high voltage level $V_H$, the counter is reset (phase counter=0). On the contrary, if there is no change in the voltage information within a certain period of time, the counter will accumulate to the upper limit to determine that the input voltage is abnormal (AC stable=0). However, this detection manner must wait for a period of observation time to determine whether the phase-loss abnormality occurs. Therefore, the hardware cost is high and the determination time is too long, which does not meet the current industry's increasing demand for response.

SUMMARY

An object of the present disclosure is to provide a phase-loss detection apparatus of a three-phase AC power source to solve the existing problems.

In order to achieve the object, the phase-loss detection apparatus of the three-phase AC power source includes an analog-to-digital converter, an exclusive OR operator, and a signal operator. The analog-to-digital converter receives any two line voltages of the three-phase AC power source with a first cycle period, and outputs a first digital signal and a second digital signal respectively corresponding to the two line voltages. The exclusive OR operator receives the first digital signal and the second digital signal, and performs an exclusive OR operation between the first digital signal and the second digital signal to generate a level signal. The signal operator receives the level signal, and accumulates a high-level time count value according to a time length of the level signal maintaining in a high level, or accumulates a low-level time count value according to a time length of the level signal maintaining in a low level. When the signal operator accumulates the high-level time count value, the signal operator resets the low-level time count value to be zero; when the signal operator accumulates the low-level time count value, the signal operator resets the high-level time count value to be zero. When the high-level time count value is greater than or equal to ⅓ of the first cycle period or the low-level time count value is greater than or equal to ⅙ of the first cycle period, the signal operator determines that the three-phase AC power source occurs a phase-loss abnormality.

In one embodiment, when the low-level time count value is greater than or equal to ⅙ of the first cycle period, the signal operator determines that a common-phase voltage of the any two line voltages occur the phase-loss abnormality.

In one embodiment, when the high-level time count value is greater than or equal to ⅓ of the first cycle period, the signal operator determines that a non-common-phase voltage of the any two line voltages occur the phase-loss abnormality.

In one embodiment, the phase-loss detection apparatus further includes a voltage sensing circuit. The voltage sensing circuit has three voltage sensors. The three voltage sensors respectively measure a voltage of each phase of the three-phase AC power source, and output the any two line voltages of the three-phase AC power source.

In one embodiment, the analog-to-digital converter receives the any two line voltages of the three-phase AC power source through the voltage sensing circuit.

In one embodiment, the analog-to-digital converter is a Schmitt trigger, and the Schmitt trigger converts the two line voltages into the first digital signal and the second digital signal.

Accordingly, the phase-loss detection apparatus of the three-phase AC power source is provided to use the analog-to-digital converter installed at the side of the three-phase AC power source to acquire two digital signals corresponding to any two line voltages of the three-phase AC power source, and the two digital signals are calculated to complete the identification of the phase difference of the three-phase power source. Compared with the conventional detection manner, it is faster and more accurate, and increases recognition of the AC power source by the inverter. Moreover, not only the response time of AC power abnormality detection is increased, but also the demand of circuit usage is reduced, thereby achieving the purposes of system performance improvement and cost reduction.

Another object of the present disclosure is to provide a method of detecting phase loss of a three-phase AC power source to solve the existing problems.

In order to achieve the object, the method includes steps of: acquiring any two line voltages of the three-phase AC power source with a first cycle period, acquiring a first digital signal and a second digital signal respectively corresponding to the two line voltages, performing an exclusive OR operation between the first digital signal and the second digital signal to generate a level signal, accumulating a high-level time count value when the level signal is maintained in a high level, or accumulating a low-level time count value when the level signal is maintained in a low level, resetting the low-level time count value to be zero when the high-level time count value is accumulated, or resetting the high-level time count value to be zero when the low-level time count value is accumulated, and determining that the three-phase AC power source occurs a phase-loss abnormality when the high-level time count value is greater than or equal to ⅓ of the first cycle period or the low-level time count value is greater than or equal to ⅙ of the first cycle period.

In one embodiment, when the low-level time count value is greater than or equal to ⅙ of the first cycle period, determining that a common-phase voltage of the any two line voltages occur the phase-loss abnormality.

In one embodiment, when the high-level time count value is greater than or equal to ⅓ of the first cycle period, determining that a non-common-phase voltage of the any two line voltages occur the phase-loss abnormality.

In one embodiment, the level signal has a second cycle period, and the second cycle period is ½ of the first cycle period.

In one embodiment, in the first cycle period, detecting twice whether the high-level time count value is greater than or equal to ⅓ of the first cycle period, and detecting twice whether the low-level time count value is greater than or equal to ⅙ of the first cycle period.

Accordingly, the method of detecting phase loss of the three-phase AC power source is provided to use the analog-to-digital converter installed at the side of the three-phase AC power source to acquire two digital signals corresponding to any two line voltages of the three-phase AC power source, and the two digital signals are calculated to complete the identification of the phase difference of the three-phase power source. Compared with the conventional detection manner, it is faster and more accurate, and increases recognition of the AC power source by the inverter. Moreover, not only the response time of AC power abnormality detection is increased, but also the demand of circuit usage is reduced, thereby achieving the purposes of system performance improvement and cost reduction.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
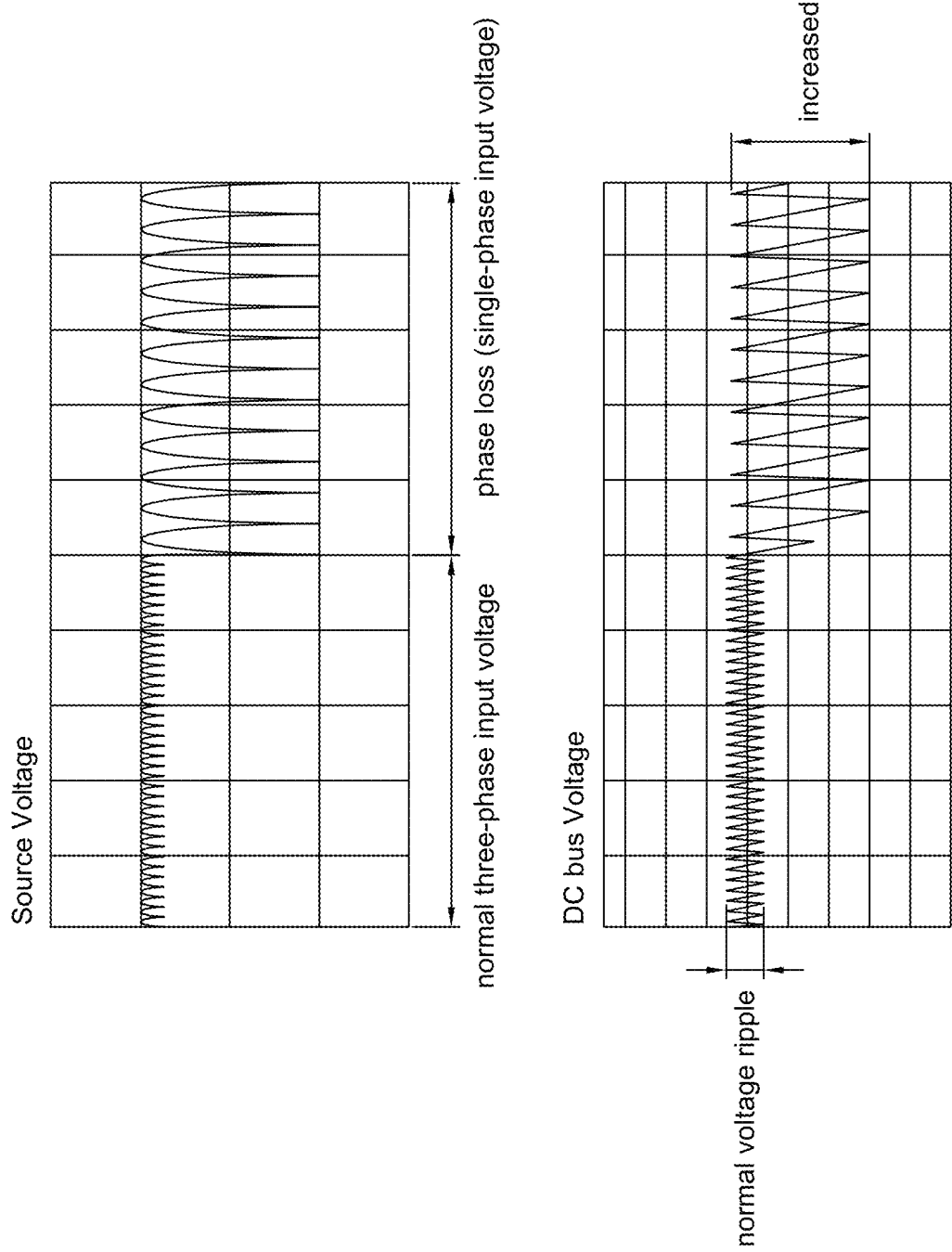
FIG. 1 is a schematic waveform diagram of a source voltage and a DC bus voltage under the phase-loss abnormality.

Reference will now be made to the drawing figures to describe the present disclosure in detail. It will be understood that the drawing figures and exemplified embodiments of present disclosure are not limited to the details thereof.

Figure 4A:
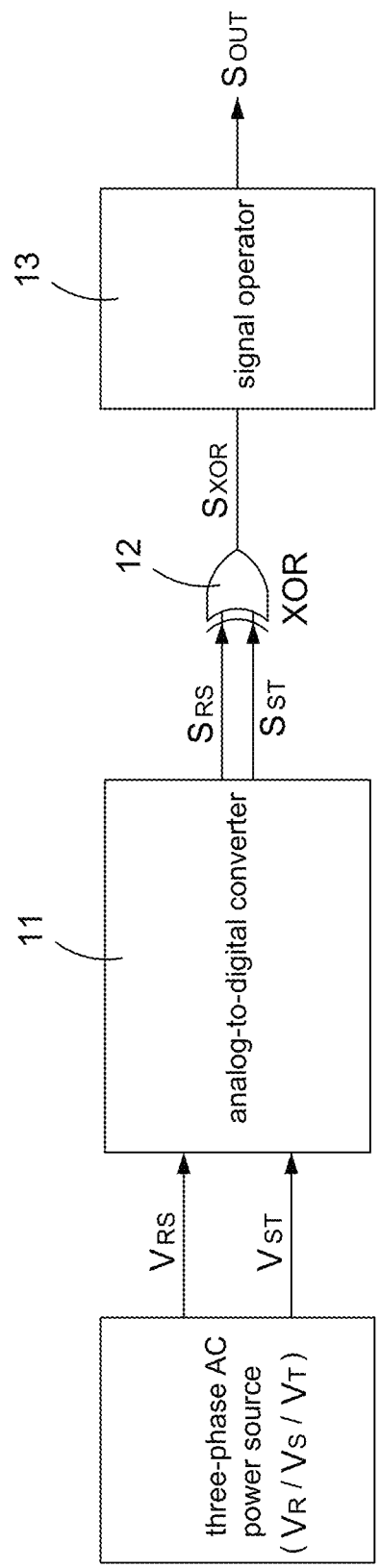
FIG. 4A is a block diagram of a phase-loss detection apparatus of a three-phase AC power source according to one embodiment of the present disclosure.

Please refer to FIG. 4A, which shows a block diagram of a phase-loss detection apparatus of a three-phase AC (alternating current) power source according to one embodiment of the present disclosure. The phase-loss detection apparatus of three-phase AC power source 10 (hereinafter referred to as "phase-loss detection apparatus 10") includes an analog-to-digital converter 11, an exclusive OR operator 12, and a signal operator 13.

In one embodiment, the analog-to-digital converter 11 receives any two line voltages of the three-phase AC power source. For example, the analog-to-digital converter 11 can receive any two line voltages of an RS line voltage (a voltage between phase R and phase S), an ST line voltage (a voltage between phase S and phase T), and a TR line voltage (a voltage between phase T and phase R) of the three-phase (R-S-T) AC power source. In one embodiment, the analog-to-digital converter 11 may receive three phase voltages (such as R-phase voltage, S-phase voltage, and T-phase voltage), and then the analog-to-digital converter 11 composes the received phase voltages to acquire the RS line voltage, the ST line voltage, and the TR line voltage. Alternatively, before the three phase voltages are received by the analog-to-digital converter 11, the three phase voltages can be pre-composed to generate the RS line voltage, the ST line voltage, and the TR line voltage, and then the analog-to-digital converter 11 receives the three line voltages (i.e., the RS line voltage, the ST line voltage, and the TR line voltage). In particular, a three-phase three-wire structure or a three-phase four-wire structure may be considered. In particular, the analog-to-digital converter 11 is used to convert an analog signal (such as a three-phase AC electrical signal) into a digital signal that can be calculated/processed by a digital controller (or a digital signal processor or a digital chip).

Figure 4B:
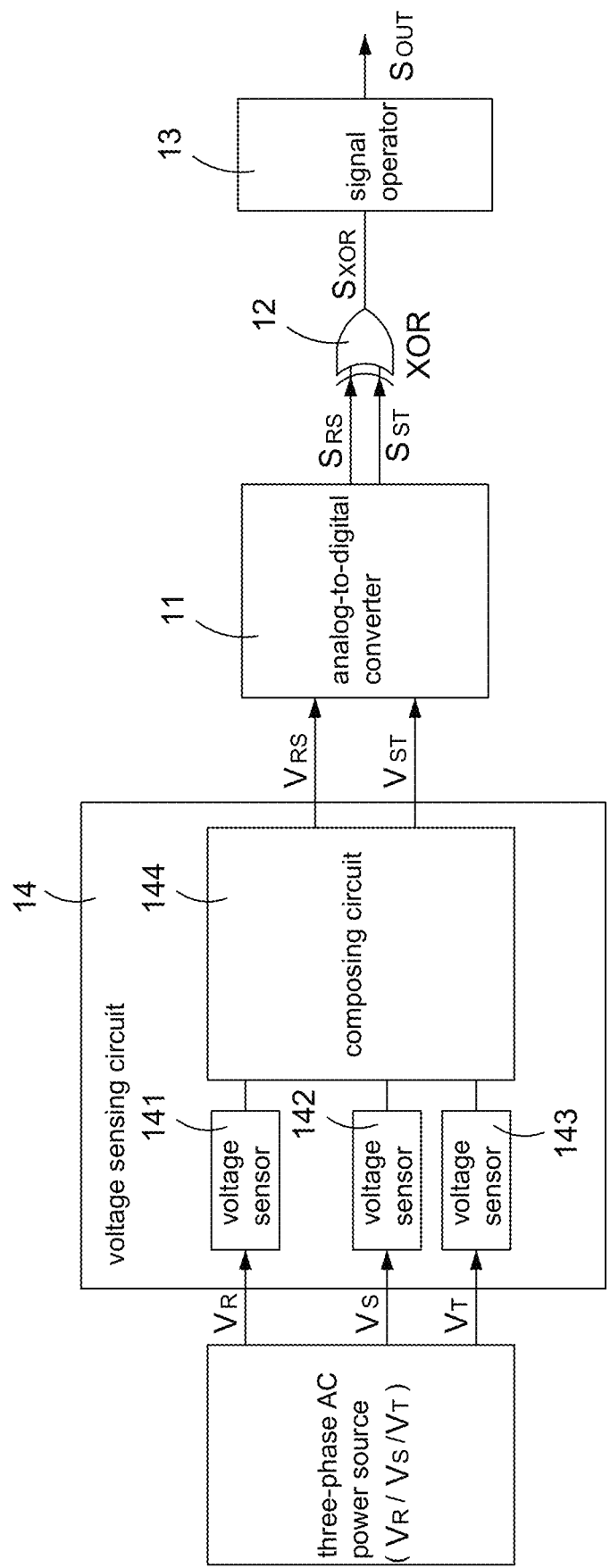
FIG. 4B is a block diagram of the phase-loss detection apparatus of the three-phase AC power source according to another embodiment of the present disclosure.

Please refer to FIG. 4B, which shows a block diagram of the phase-loss detection apparatus of the three-phase AC power source according to another embodiment of the present disclosure. In one embodiment, the phase-loss detection apparatus 10 further includes a voltage sensing circuit 14. The voltage sensing circuit 14 has three voltage sensors 141,142,143 and a composing circuit 144. The three voltage sensors 141,142,143 respectively measure a voltage of each phase (i.e., the R-phase voltage, the S-phase voltage, and the T-phase voltage) of the three-phase AC power source. The composing circuit 144 outputs the any two line voltages of the RS line voltage (the voltage between phase R and phase S), the ST line voltage (the voltage between phase S and phase T), and the TR line voltage (the voltage between phase T and phase R) of the three-phase (R-S-T) AC power source according to the three phase voltages measured by the voltage sensors 141,142,143 to the analog-to-digital converter 11. Take FIG. 4B as an example, the analog-to-digital converter 11 receives the RS line voltage $V_{RS}$ and the ST line voltage $V_{ST}$ through the voltage sensing circuit 14. In particular, the voltage sensing circuit 14 may be, for example but not limited to, a three-phase three-wire configuration or a three-phase four-wire configuration.

To facilitate the description of the operation and principle of the phase-loss detection apparatus 10 of the present disclosure, the RS line voltage and the ST line voltage are exemplified for further demonstration. Therefore, the analog-to-digital converter 11 shown in FIG. 4A receives the RS line voltage $V_{RS}$ and the ST line voltage $V_{ST}$, but the TR line voltage $V_{TR}$ is not labeled. Similarly, the selection of the ST line voltage and the TR line voltage or the selection of the TR line voltage and the RS line voltage is an extension of the same technical concept, and the detail description is omitted here for conciseness and no additional diagram representation is added.

Figure 5:
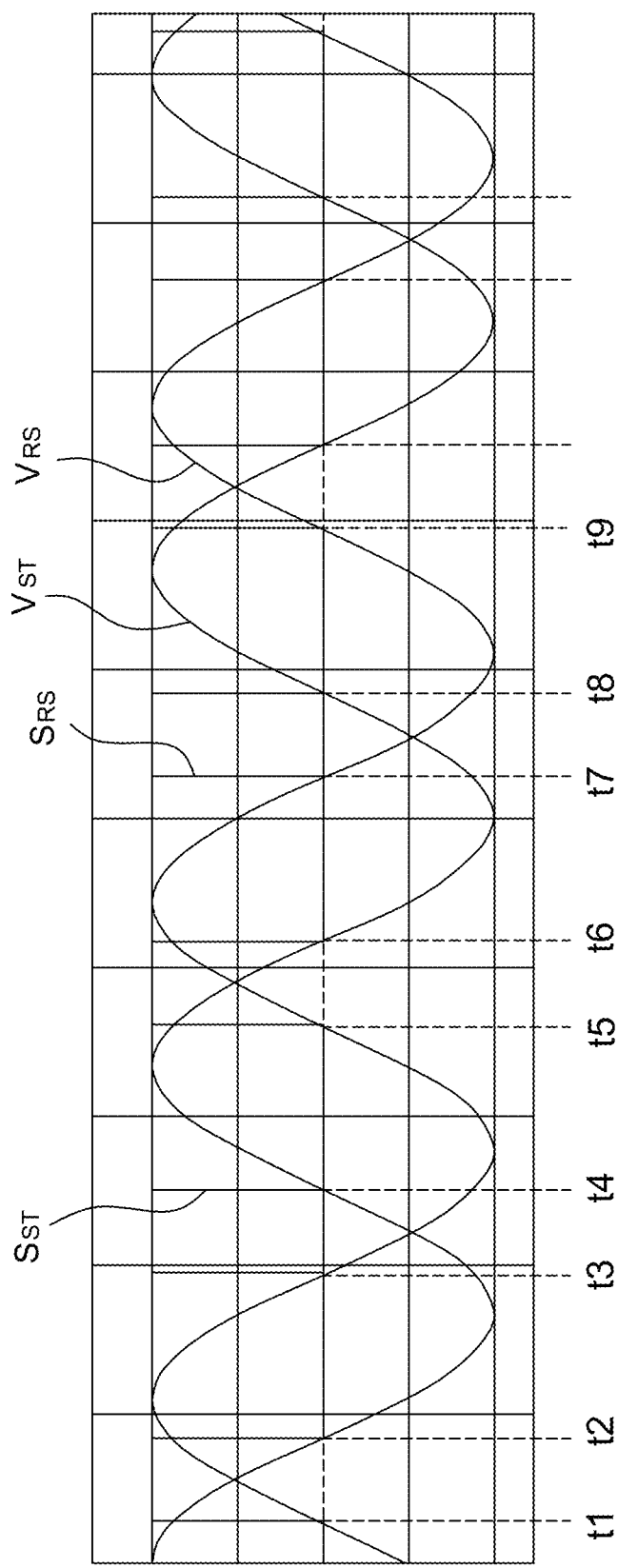
FIG. 5 is a schematic waveform of a relationship between line voltages and digital signals according to the present disclosure.

Please refer to FIG. 5, which shows a schematic waveform of a relationship between line voltages and digital signals according to the present disclosure. An electrical angle difference between the RS line voltage $V_{RS}$ and the ST line voltage $V_{ST}$ is 120 degrees, i.e., ⅓ of one cycle period. The analog-to-digital converter 11 receives the RS line voltage $V_{RS}$ and the ST line voltage $V_{ST}$, and converts the analog signals, such as the RS line voltage $V_{RS}$ and the ST line voltage $V_{ST}$ into digital signals. As shown in FIG. 5, between time point t1 and time point t3, the RS line voltage $V_{RS}$ is positive, and after one cycle period, i.e., between time point t5 and time point t7, the RS line voltage $V_{RS}$ is also positive. At time points t1,t3,t5,t7 the RS line voltage $V_{RS}$ is zero-voltage crossing, that is, time points t1,t3,t5,t7 are zero-voltage crossing points of the RS line voltage $V_{RS}$. Similarly, between time point t4 and time point t6, the ST line voltage $V_{ST}$ is positive, and at time points t4,t6, the ST line voltage $V_{ST}$ is zero-voltage crossing, that is, time points t4,t6 are zero-voltage crossing points. Incidentally, the analog-to-digital converter 11 may be, for example but not limited to, implemented by a Schmitt trigger. Any circuit capable of converting an analog signal into a digital signal can be used as the analog-to-digital converter 11 of the present disclosure. The operation principle and technical information of the Schmitt trigger can be found in Wikipedia, such as the disclosure on the webpage https://en.wikipedia.org/wiki/Schmitt_trigger, so the detail description is omitted here for conciseness.

Take the positive ST line voltage $V_{ST}$ between time point t4 and time point t6 and the positive RS line voltage $V_{RS}$ between time point t5 and time point t7 as an example, the ST line voltage $V_{ST}$ changes from negative to positive at time point t4 and the RS line voltage $V_{RS}$ changes from negative to positive at time point t5. The time length between time point t4 and time point t5 is 120 degrees, i.e., ⅓ of one cycle period.

After the conversion processing by the analog-to-digital converter 11, an RS digital signal $S_{RS}$ (also referred to as a first digital signal) corresponding to the RS line voltage $V_{RS}$ and an ST digital signal $S_{ST}$ (also referred to as a second digital signal) corresponding to the ST line voltage $V_{ST}$ are acquired. In other words, between time point t4 and time point t6, the ST digital signal $S_{ST}$ is high-level, however, between time point t2 and time point t4 and between time point t6 and time point t8, the ST digital signal $S_{ST}$ is low-level; between time point t5 and time point t7, the RS digital signal $S_{RS}$ is high-level, however, between time point t3 and time point t5 and between time point t7 and time point t9, the RS digital signal $S_{RS}$ is low-level.

Refer to FIG. 4A again, the exclusive OR operator 12 receives the first digital signal, i.e., the RS digital signal $S_{RS}$ and the second digital signal, i.e., the ST digital signal $S_{ST}$, and performs an exclusive OR operation between the first digital signal and the second digital signal to generate a level signal $S_{XOR}$. According to the principle of the exclusive OR operation: if signal levels of two input signals are different (i.e., one is high-level and the other is low-level), the level signal $S_{XOR}$ is a high-level signal; if signal levels of two input signals are the same (i.e., both are high-level or both are low-level), the level signal $S_{XOR}$ is a low-level signal.

Therefore, according to the level of the RS digital signal $S_{RS}$ and the level of the ST digital signal $S_{ST}$ in different time periods, after the exclusive OR operation between the RS digital signal $S_{RS}$ and the ST digital signal $S_{ST}$ by the exclusive OR operator 12, the corresponding levels of the level signal $S_{XOR}$ are shown in Table 1 as follows.

TABLE 1

| time interval | RS digital signal $S_{RS}$ | ST digital signal $S_{ST}$ | level signal $S_{XOR}$ |
| --- | --- | --- | --- |
| t1-t2 | high | high | low |
| t2-t3 | high | low | high |
| t3-t4 | low | low | low |
| t4-t5 | low | high | high |
| t5-t6 | high | high | low |
| t6-t7 | high | low | high |
| t7-t8 | low | low | low |
| t8-t9 | low | high | high |

Figure 6:
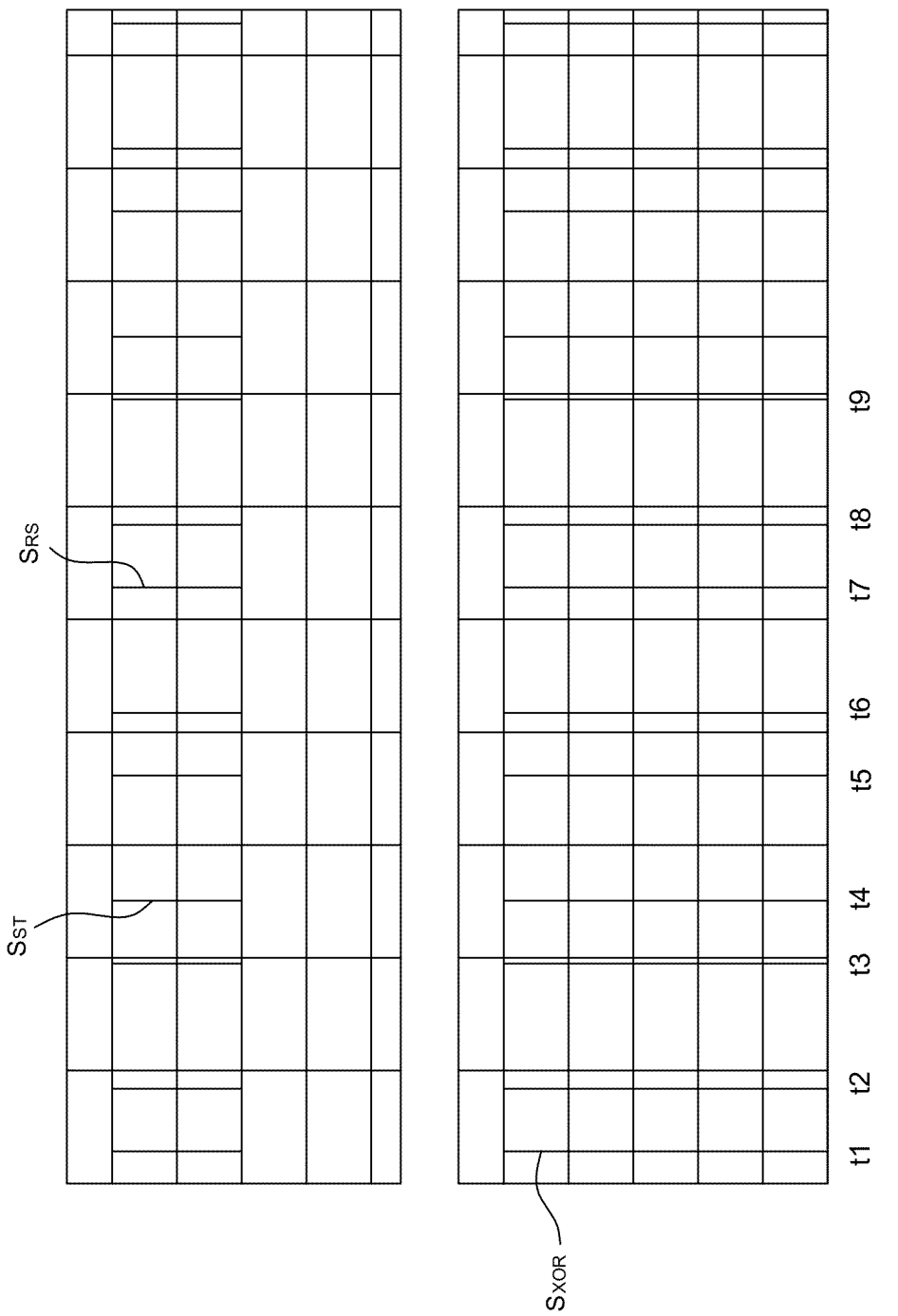
FIG. 6 is a schematic waveform between the level signal and the digital signals according to the present disclosure.

Please refer to FIG. 6, which shows a schematic waveform between the level signal and the digital signals according to the present disclosure. The level change of the level signal $S_{XOR}$ by performing the exclusive OR operation can be clearly seen in FIG. 6. In other words, if the phase type of phase-loss detection hardware circuit proposed in the present disclosure detects that the RS line voltage $V_{RS}$ and the ST line voltage $V_{ST}$ are positive, the corresponding RS digital signal $S_{RS}$ and ST digital signal $S_{ST}$ are high-level; on the contrary, if the RS line voltage $V_{RS}$ and the ST line voltage $V_{ST}$ are negative, the corresponding RS digital signal $S_{RS}$ and ST digital signal $S_{ST}$ are low-level. Therefore, when the three-phase AC power source is normal, a controller (or a control unit) may receive the RS digital signal $S_{RS}$ and the ST digital signal $S_{ST}$ with a phase difference of 120 degrees.

Figure 7:
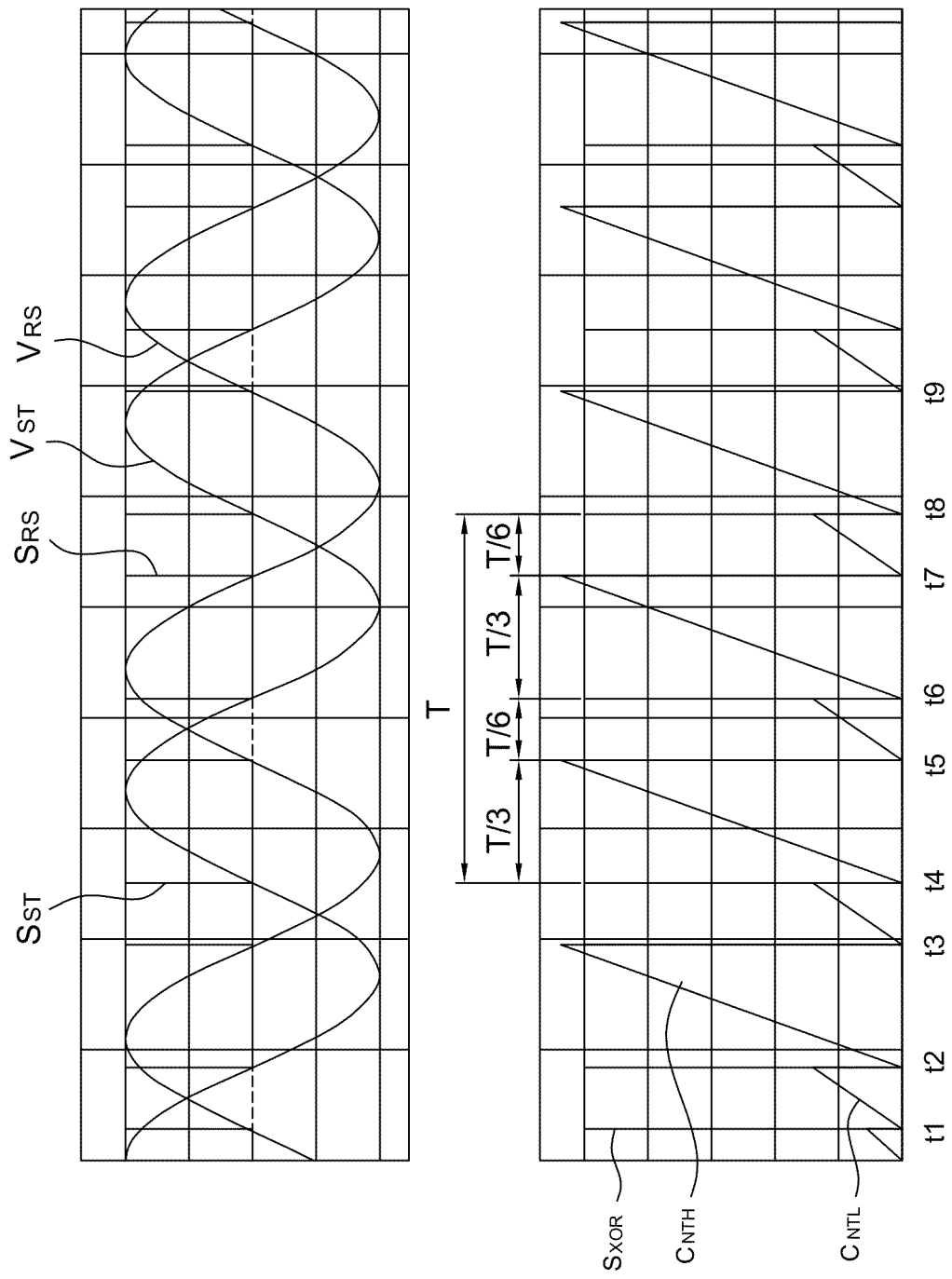
FIG. 7 is a schematic waveform of a relationship between a high-level time count value, a low-level time count value, and a level signal according to the present disclosure.

Refer to FIG. 4 again, the signal operator 13 receives the level signal $S_{XOR}$, and accumulates counting numbers according to the level of the level signal $S_{XOR}$. For example, when the level of the level signal $S_{XOR}$ maintains in the high level, a high-level time count value $C_{NTH}$ is accumulated; when the level of the level signal $S_{XOR}$ maintains in the low level, a low-level time count value $C_{NTL}$ is accumulated. Please refer to FIG. 7, which shows a schematic waveform of a relationship between a high-level time count value, a low-level time count value, and a level signal according to the present disclosure. When the three-phase AC power source is normal (no the phase-loss abnormality), between time point t1 and time point t2 listed in Table 1, since the RS digital signal $S_{RS}$ is high-level and the ST digital signal $S_{ST}$ is high-level, the level signal $S_{XOR}$ is low-level. At this condition, the low-level time count value $C_{NTL}$ is continuously accumulated, and the high-level time count value $C_{NTH}$ is reset to zero.

Similarly, between time point t4 and time point t5, since the RS digital signal $S_{RS}$ is low-level and the ST digital signal $S_{ST}$ is high-level, the level signal $S_{XOR}$ is high-level. At this condition, the high-level time count value $C_{NTH}$ is continuously accumulated, and the low-level time count value $C_{NTL}$ is reset to zero. And then, between time point t5 and time point t6, since the RS digital signal $S_{RS}$ is high-level and the ST digital signal $S_{ST}$ is high-level, the level signal $S_{XOR}$ is low-level. At this condition, the low-level time count value $C_{NTL}$ is continuously accumulated, and the high-level time count value $C_{NTH}$ is reset to zero. And then, between time point t6 and time point t7, since the RS digital signal $S_{RS}$ is high-level and the ST digital signal $S_{ST}$ is low-level, the level signal $S_{XOR}$ is high-level. At this condition, the high-level time count value $C_{NTH}$ is continuously accumulated, and the low-level time count value $C_{NTL}$ is reset to zero.

Therefore, under the normality of the three-phase AC power source, the accumulation of the high-level time count value $C_{NTH}$ and the accumulation of the low-level time count value $C_{NTL}$ are alternately performed. That is, the high-level time count value $C_{NTH}$ is accumulated but the low-level time count value $C_{NTL}$ is reset between time point t4 and time point t5, and then the low-level time count value $C_{NTL}$ is accumulated but the high-level time count value $C_{NTH}$ is reset between time point t5 and time point t6. Moreover, since the alternate of the high/low levels between the RS digital signal $S_{RS}$ and the ST digital signal $S_{ST}$, the high-level time count value $C_{NTH}$ is not greater than or equal to ⅓ of the cycle period (i.e., ⅓T, such as between time point t4 and time point t5), and then the low-level time count value $C_{NTL}$ is alternately accumulated. Similarly, since the low-level time count value $C_{NTL}$ is not greater than or equal to ⅙ of the cycle period (i.e., ⅙T, such as between time point t5 and time point t6), and then the high-level time count value $C_{NTH}$ is alternately accumulated. In particular, the level signal $S_{XOR}$ has a second cycle period, and the second cycle period is ½ of the first cycle period. Therefore, in the first cycle period, the high-level time count value $C_{NTH}$ is detected twice to determine whether it is greater than or equal to ⅓ of the first cycle period, and the low-level time count value $C_{NTL}$ is detected twice to determine whether it is greater than or equal to ⅙ of the first cycle period.

Therefore, under this regular characteristic, the signal operator 13 can determine whether the three-phase AC power source occurs the phase-loss abnormality according to the high-level time count value $C_{NTH}$ and the low-level time count value $C_{NTL}$. In other words, when the signal operator 13 detects that the high-level time count value $C_{NTH}$ is greater than or equal to ⅓ of the cycle period, or detects that the low-level time count value $C_{NTL}$ is greater than or equal to ⅙ of the cycle period, the signal operator 13 determines that the three-phase AC power source occurs the phase-loss abnormality. At this condition, the signal operator 13 provides an output signal $S_{OUT}$ for the notification of the phase-loss abnormality. Alternatively, the signal operator 13 provides the output signal $S_{OUT}$ with different levels for the notification of the phase-loss abnormality. For example, when the high-level time count value $C_{NTH}$ is greater than or equal to ⅓ of the cycle period or the low-level time count value $C_{NTL}$ is greater than or equal to ⅙ of the cycle period, the signal operator 13 outputs the high-level output signal $S_{OUT}$ for the notification of the phase-loss abnormality. On the contrary, when the high-level time count value $C_{NTH}$ is not greater than or equal to ⅓ of the cycle period or the low-level time count value $C_{NTL}$ is not greater than or equal to ⅙ of the cycle period, the signal operator 13 outputs the low-level output signal $S_{OUT}$ for the notification of no phase-loss abnormality.

In other words, when the level signal $S_{XOR}$ is high-level, the high-level time count value $C_{NTH}$ is continuously accumulated, and the low-level time count value $C_{NTL}$ is reset to zero. On the contrary, when the level signal $S_{XOR}$ is low-level, the low-level time count value $C_{NTL}$ is continuously accumulated, and the high-level time count value $C_{NTH}$ is reset to zero. Therefore, the phase difference between the RS digital signal $S_{RS}$ and the ST digital signal $S_{ST}$ can be determined. Under the normality of the three-phase AC power source, the high-level time count value $C_{NTH}$ is less than ⅓ of the cycle period, and the low-level time count value $C_{NTL}$ is less than ⅙ of the cycle period. Therefore, if either the high-level time count value $C_{NTH}$ or the low-level time count value $C_{NTL}$ is greater than or equal to the corresponding normal count values, the phase-loss abnormality will be detected.

In different embodiments, the exclusive OR operator 12 and the signal operator 13 may be, but not limited to, two separate circuits or components, or the exclusive OR operator 12 and the signal operator 13 may be integrated into one logic circuit, but this is not a limitation this invention.

Figure 2:
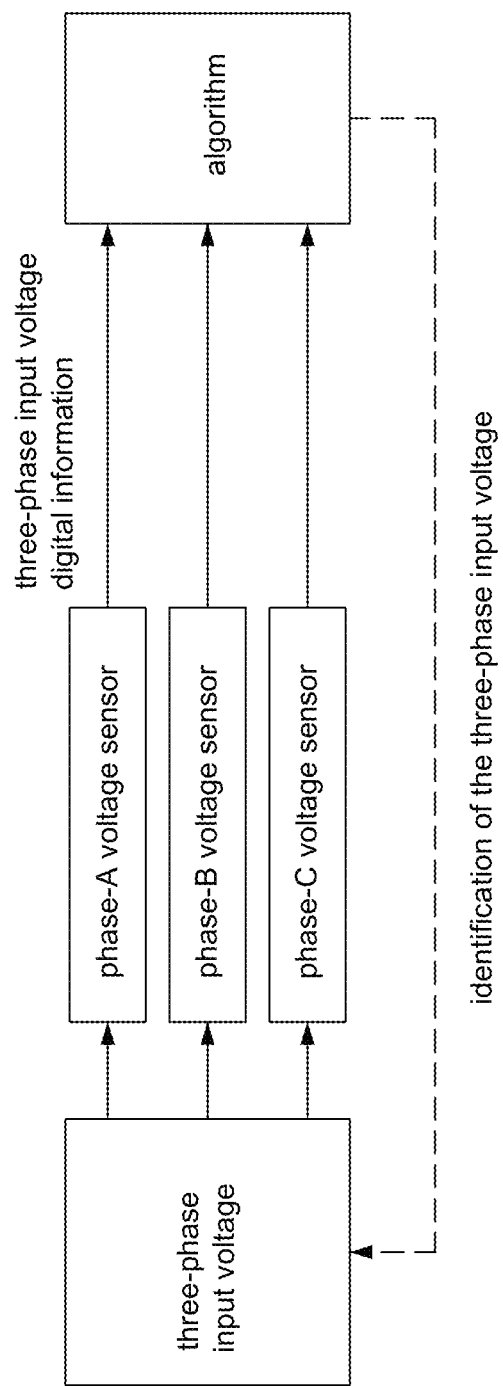
FIG. 2 is a block diagram of a conventional level type of phase-loss detection structure.
Figure 3:
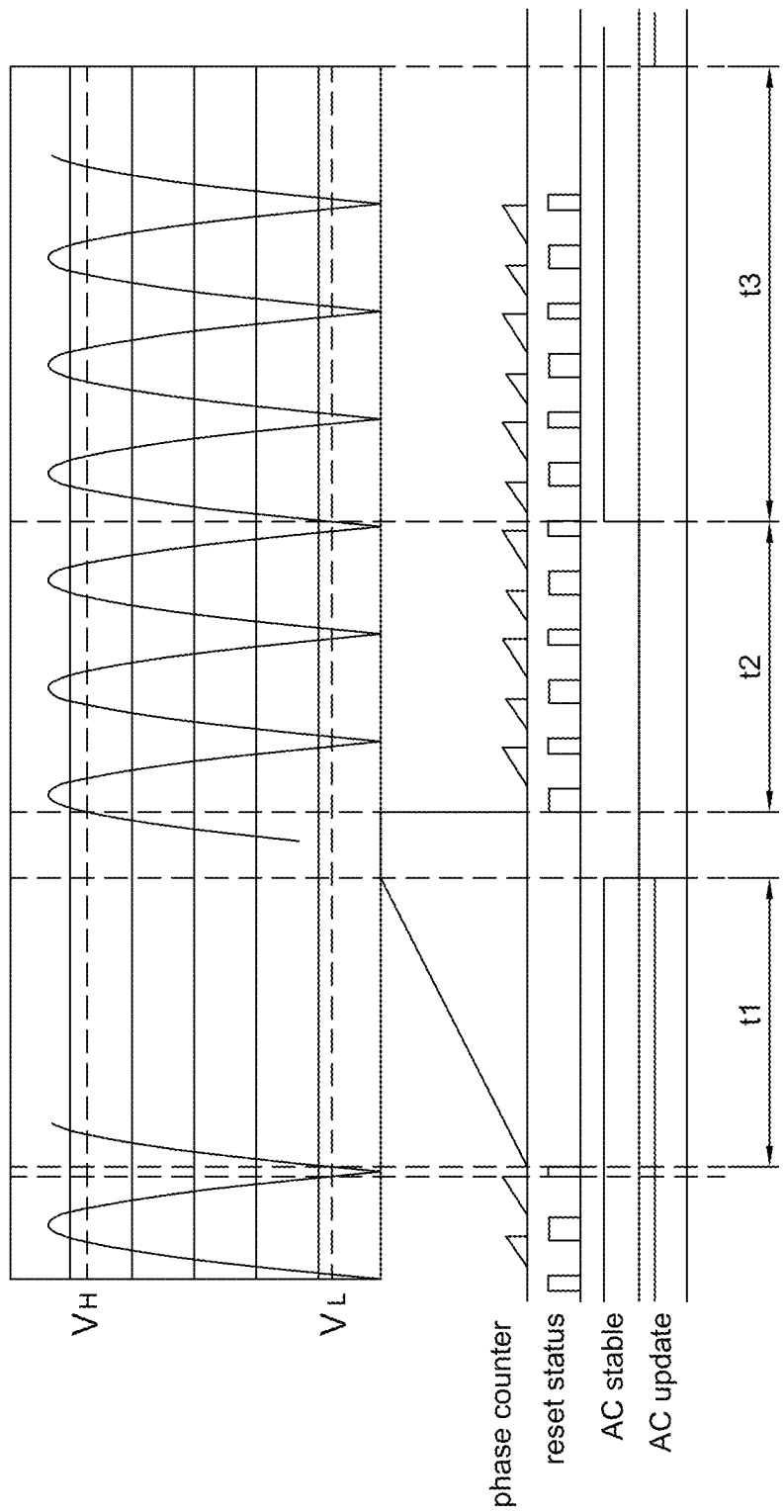
FIG. 3 is a schematic waveform diagram of operating the conventional level type of phase-loss detection structure.

In the following, based on the RS line voltage $V_{RS}$ and the ST line voltage $V_{ST}$ (corresponding to the RS digital signal $S_{RS}$ and the ST digital signal $S_{ST}$), the phase-loss abnormality due to line break fault of separate R-S-T phases will be described as follows. Please refer to FIG. 8, which shows a schematic waveform diagram of phase-loss detection under the S-phase break fault according to the present disclosure. Due to the S-phase line break fault, the RS line voltage $V_{RS}$ is equivalent to a voltage $V_R$ ($V_{RS}=V_R-V_S=V_R-0=V_R$), and the ST line voltage $V_{ST}$ is equivalent to a voltage ($-V_T$) ($V_{ST}=V_S-V_T=0-V_T=-V_T$). Therefore, the RS line voltage $V_{RS}$ (equivalent to $V_R$) and the ST line voltage $V_{ST}$ (equivalent to $-V_T$) are in phase (no electrical angle difference). At this condition, the level signal $S_{XOR}$ acquired by performing the exclusive OR operation is low-level. When the low-level time count value $C_{NTL}$ is accumulated to the maximum low-level time count value (i.e., ⅙T), the output signal $S_{OUT}$ provided from the signal operator 13 is used for the notification of the S-phase phase-loss abnormality. In one cycle period, the phase type of phase-loss detection apparatus can perform four count detections. As the waveform shown in the fourth column of FIG. 8, the number of detection of the phase type of phase-loss detection apparatus is twice that of the conventional (level type) detection manner, and therefore the determination response is faster. In terms of hardware, the level type (conventional) detector must be equipped with three voltage sensors (as shown in FIG. 2), and three analog-to-digital converter pins (ADC pins) must be used to read the three-phase voltage values. However, compared with the conventional level type phase-loss detector, the phase type of phase-loss detection apparatus of the present disclosure only needs to read digital signals of any two line voltages, such as the RS line voltage $V_{RS}$ and the ST line voltage $V_{ST}$. Also, only two input and output pins (IO pin) needs to be used to read the RS digital signal $S_{RS}$ and the ST digital signal $S_{ST}$, or even only one input and output pin needs to be used to read the level signal $S_{XOR}$ (digital signal). On the whole, it not only increases the response time of AC power abnormality detection, but also reduces the demand of circuit usage, thereby achieving the purposes of system performance improvement and cost reduction.

Figure 9:
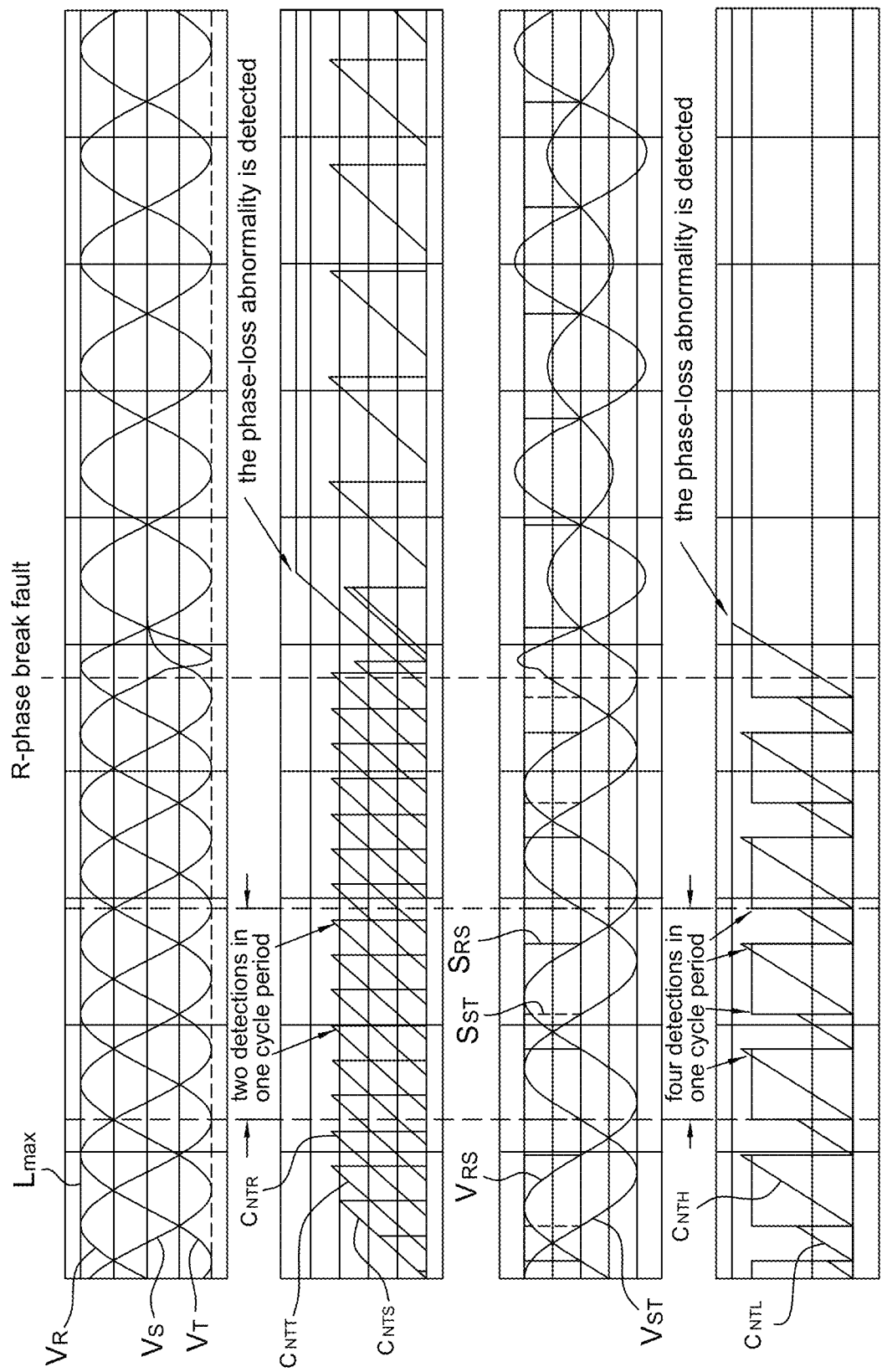
FIG. 9 is a schematic waveform diagram of phase-loss detection under an R-phase break fault according to the present disclosure.

Please refer to FIG. 9, which shows a schematic waveform diagram of phase-loss detection under the R-phase break fault according to the present disclosure. Due to the R-phase line break fault, the RS line voltage $V_{RS}$ is equivalent to a voltage $(-V_S)$ ($V_{RS}=V_R-V_S=0-V_S=-V_S$), and the ST line voltage $V_{ST}$ is to a voltage $V_{ST}$ ($V_{ST}=V_S-V_T=V_{ST}$). Therefore, the RS line voltage $V_{RS}$ (equivalent to $-V_S$) and the ST line voltage $V_{ST}$ (is to $V_{ST}$) are opposite in phase. At this condition, the level signal $S_{XOR}$ acquired by performing the exclusive OR operation is high-level. When the high-level time count value $C_{NTH}$ is accumulated to the maximum high-level time count value (i.e., ⅓T), the output signal $S_{OUT}$ provided from the signal operator 13 is used for the notification of the R-phase phase-loss abnormality. In one cycle period, the phase type of phase-loss detection apparatus can perform four count detections. As the waveform shown in the fourth column of FIG. 9, the number of detection of the phase type of phase-loss detection apparatus is twice that of the conventional (level type) detection manner, and therefore the determination response is faster. In terms of hardware, the level type (conventional) detector must be equipped with three voltage sensors (as shown in FIG. 2), and three analog-to-digital converter pins (ADC pins) must be used to read the three-phase voltage values. However, compared with the conventional level type phase-loss detector, the phase type of phase-loss detection apparatus of the present disclosure only needs to read digital signals of any two line voltages, such as the RS line voltage $V_{RS}$ and the ST line voltage $V_{ST}$. Also, only two input and output pins (IO pin) needs to be used to read the RS digital signal $S_{RS}$ and the ST digital signal $S_{ST}$, or even only one input and output pin needs to be used to read the level signal $S_{XOR}$ (digital signal). On the whole, it not only increases the response time of AC power abnormality detection, but also reduces the demand of circuit usage, thereby achieving the purposes of system performance improvement and cost reduction.

Figure 10:
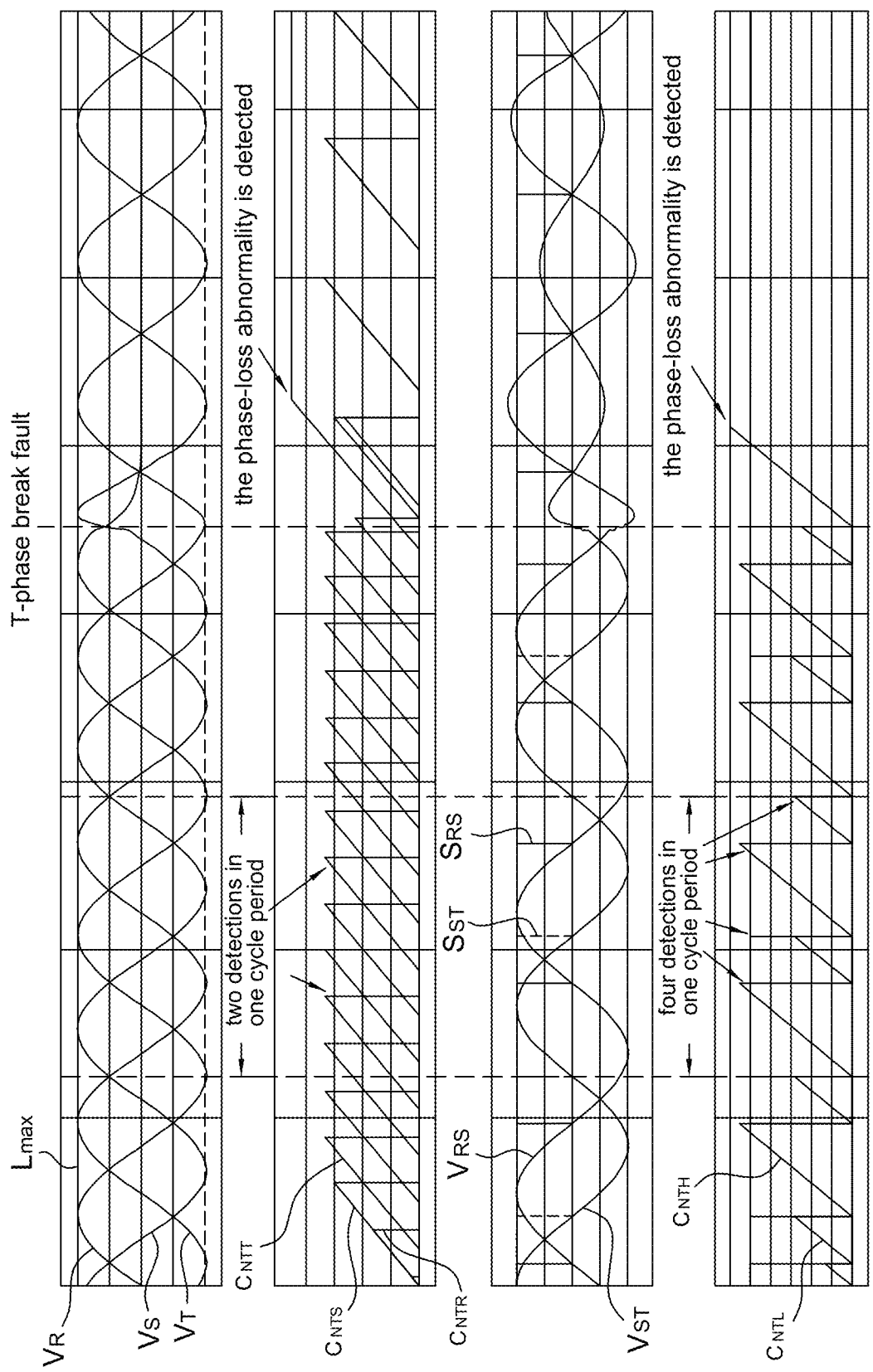
FIG. 10 is a schematic waveform diagram of phase-loss detection under a T-phase break fault according to the present disclosure.

Please refer to FIG. 10, which shows a schematic waveform diagram of phase-loss detection under the T-phase break fault according to the present disclosure. Due to the T-phase line break fault, the RS line voltage $V_{RS}$ is to a voltage $V_{RS}$ ($V_{RS}=V_R-V_S=V_{RS}$), and the ST line voltage $V_{ST}$ is equivalent to a voltage $V_S$ ($V_{ST}=V_S-V_T=V_S-0=V_S$). Therefore, the RS line voltage $V_{RS}$ (is to $V_{RS}$) and the ST line voltage $V_{ST}$ (is equivalent to $V_S$) are opposite in phase. At this condition, the level signal $S_{XOR}$ acquired by performing the exclusive OR operation is high-level. When the high-level time count value $C_{NTH}$ is accumulated to the maximum high-level time count value (i.e., ⅓T), the output signal $S_{OUT}$ provided from the signal operator 13 is used for the notification of the T-phase phase-loss abnormality. In one cycle period, the phase type of phase-loss detection apparatus can perform four count detections. As the waveform shown in the fourth column of FIG. 10, the number of detection of the phase type of phase-loss detection apparatus is twice that of the conventional (level type) detection manner, and therefore the determination response is faster. In terms of hardware, the level type (conventional) detector must be equipped with three voltage sensors (as shown in FIG. 2), and three analog-to-digital converter pins (ADC pins) must be used to read the three-phase voltage values. However, compared with the conventional level type phase-loss detector, the phase type of phase-loss detection apparatus of the present disclosure only needs to read digital signals of any two line voltages, such as the RS line voltage $V_{RS}$ and the ST line voltage $V_{ST}$. Also, only two input and output pins (IO pin) needs to be used to read the RS digital signal $S_{RS}$ and the ST digital signal $S_{ST}$, or even only one input and output pin needs to be used to read the level signal $S_{XOR}$ (digital signal). On the whole, it not only increases the response time of AC power abnormality detection, but also reduces the demand of circuit usage, thereby achieving the purposes of system performance improvement and cost reduction.

Figure 8:
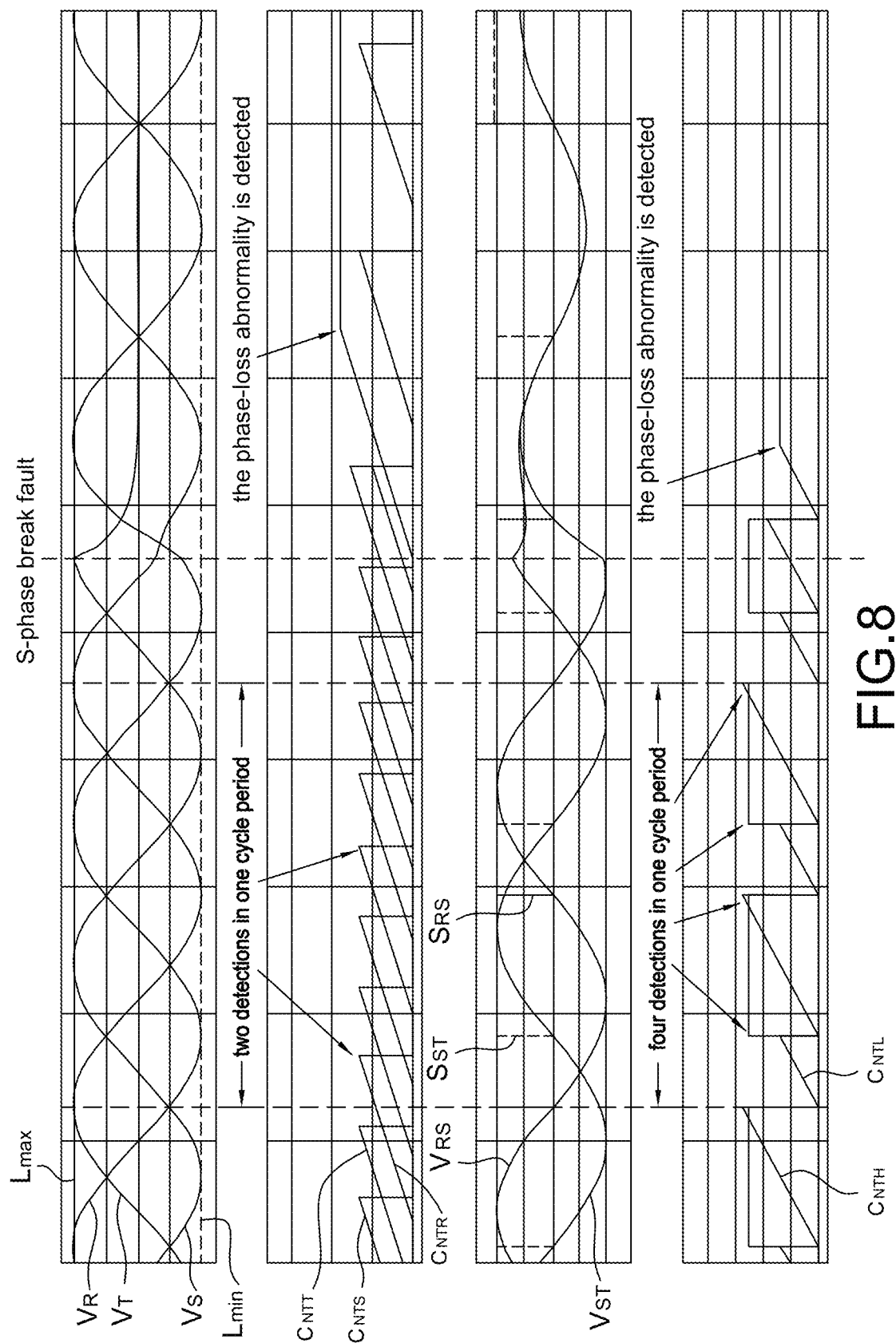
FIG. 8 is a schematic waveform diagram of phase-loss detection under an S-phase break fault according to the present disclosure.

According to the above description of the three-phase line break fault FIG. 8 to FIG. 10, when the low-level time count value $C_{NTL}$ is greater than or equal to ⅙ of the cycle period, a common-phase voltage of the any two line voltages occurring the phase-loss abnormality can be detected. As shown in FIG. 8, when the common-phase (S-phase) line break fault occurs, the low-level time count value $C_{NTL}$ is continuously accumulated to be greater than or equal to ⅙ of the cycle period. When the high-level time count value $C_{NTH}$ is greater than or equal to ⅓ of the cycle period, a non-common-phase voltage of the any two line voltages occurring the phase-loss abnormality can be detected. As shown in FIG. 9, when the non-common-phase (R-phase) line break fault occurs, or as shown in FIG. 10, when the non-common-phase (T-phase) line break fault occurs, the high-level time count value $C_{NTH}$ is continuously accumulated to be greater than or equal to ⅓ of the cycle period.

Figure 11:
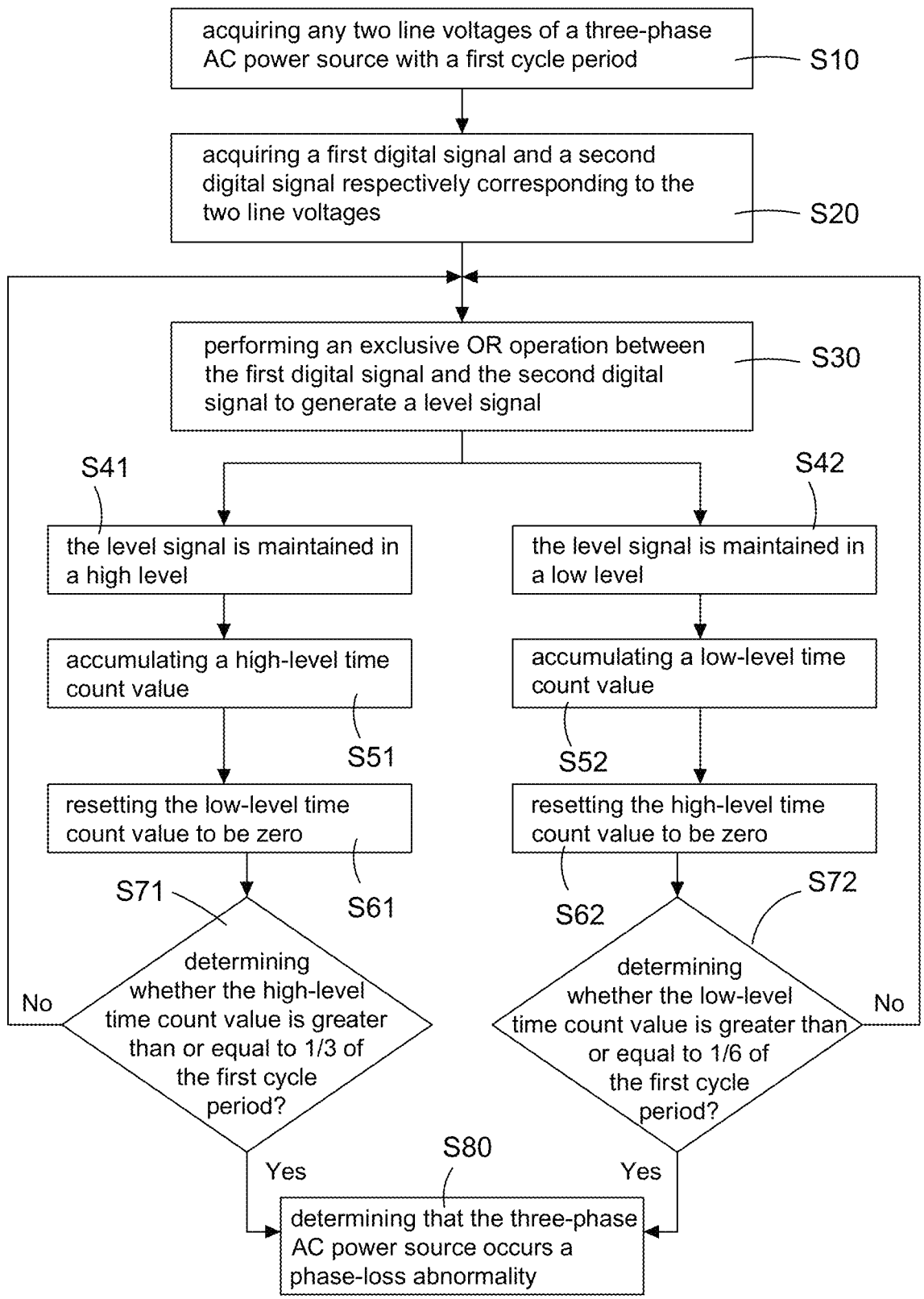
FIG. 11 is a flowchart of a method of detecting phase loss of a three-phase AC power source according to the present disclosure.

Please refer to FIG. 11, which shows a flowchart of a method of detecting phase loss of a three-phase AC power source according to the present disclosure. The method of detecting phase loss of the three-phase AC power source includes steps of: First, acquiring any two line voltages of the three-phase AC power source with a first cycle period (S10). For example, any two line voltages of an RS line voltage (a voltage between phase R and phase S), an ST line voltage (a voltage between phase S and phase T), and a TR line voltage (a voltage between phase T and phase R) of the three-phase (R-S-T) AC power source may be acquired.

Afterward, acquiring a first digital signal and a second digital signal respectively corresponding to the two line voltages by an analog-to-digital conversion (S20).

Afterward, performing an exclusive OR operation between the first digital signal and the second digital signal to generate a level signal (S30). If signal levels of two input signals are different (i.e., one is high-level and the other is low-level), the level signal is a high-level signal; if signal levels of two input signals are the same (i.e., both are high-level or both are low-level), the level signal is a low-level signal.

Afterward, accumulating a high-level time count value (S51) when the level signal is maintained in a high level (S41). On the contrary, accumulating a low-level time count value (S52) when the level signal is maintained in a low level (S42). Afterward, resetting the low-level time count value to be zero when the high-level time count value is accumulated (S61); resetting the high-level time count value to be zero when the low-level time count value is accumulated (S62). Under the normality of the three-phase AC power source, the accumulation of the high-level time count value and the accumulation of the low-level time count value are alternately performed. Since the alternate of the high/low levels between the RS digital signal and the ST digital signal, the high-level time count value is not greater than or equal to ⅓ of the cycle period (i.e., ⅓T), and then the low-level time count value is alternately accumulated. Similarly, since the low-level time count value is not greater than or equal to ⅙ of the cycle period (i.e., ⅙T), and then the high-level time count value is alternately accumulated.

Afterward, determining that the three-phase AC power source occurs a phase-loss abnormality (S80) when the high-level time count value is greater than or equal to ⅓ of the first cycle period (i.e., the determination result of step (S71) is "YES") or the low-level time count value is greater than or equal to ⅙ of the first cycle period (i.e., the determination result of step (S72) is "YES"). On the contrary, if the determination result of step (S71) is "NO" or the determination result of step (S72) is "NO", no the phase-loss abnormality occurs, and therefore step (S30) is performed.

The phase-loss detection apparatus of the three-phase AC power source and the method of detecting phase loss are provided to use the analog-to-digital converter 11 to acquire the RS digital signal $S_{RS}$ and the ST digital signal $S_{ST}$, and the two signals are calculated to complete the identification of the phase difference of the three-phase power source. Compared with the conventional detection manner, it is faster and more accurate, and increases recognition of the AC power source by the inverter.

In summary, the present disclosure has the following features and advantages:

1. The analog-to-digital converter installed at the side of the three-phase AC power source is used to acquire two digital signals corresponding to any two line voltages of the three-phase AC power source, and the two digital signals are calculated to complete the identification of the phase difference of the three-phase power source. Compared with the conventional detection manner, it is faster and more accurate, and increases recognition of the AC power source by the inverter.

2. The phase type of phase-loss detection structure and algorithm are provided to determine the phase-loss abnormality in real time to solve the shortcomings of the conventional detection manner and rigorously verify whether the AC power source is abnormal.

3. On the whole, it not only increases the response time of AC power abnormality detection, but also reduces the demand of circuit usage, thereby achieving the purposes of system performance improvement and cost reduction.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A phase-loss detection apparatus of a three-phase AC power source, comprising:
    an analog-to-digital converter configured to receive any two line voltages of the three-phase AC power source with a first cycle period, and output a first digital signal and a second digital signal respectively corresponding to the two line voltages,
    an exclusive OR operator configured to receive the first digital signal and the second digital signal, and perform an exclusive OR operation between the first digital signal and the second digital signal to generate a level signal, and
    a signal operator configured to receive the level signal, and accumulate a high-level time count value according to a time length of the level signal maintaining in a high level, or accumulate a low-level time count value according to a time length of the level signal maintaining in a low level,
    wherein when the signal operator accumulates the high-level time count value, the signal operator resets the low-level time count value to be zero; when the signal operator accumulates the low-level time count value, the signal operator resets the high-level time count value to be zero;
    wherein when the high-level time count value is greater than or equal to ⅓ of the first cycle period or the low-level time count value is greater than or equal to ⅙ of the first cycle period, the signal operator determines that the three-phase AC power source occurs a phase-loss abnormality.

2. The phase-loss detection apparatus as claimed in claim 1, wherein when the low-level time count value is greater than or equal to ⅙ of the first cycle period, the signal operator determines that a common-phase voltage of the any two line voltages occur the phase-loss abnormality.

3. The phase-loss detection apparatus as claimed in claim 1, wherein when the high-level time count value is greater than or equal to ⅓ of the first cycle period, the signal operator determines that a non-common-phase voltage of the any two line voltages occur the phase-loss abnormality.

4. The phase-loss detection apparatus as claimed in claim 1, further comprising:
    a voltage sensing circuit having three voltage sensors configured to respectively measure a voltage of each phase of the three-phase AC power source, and output the any two line voltages of the three-phase AC power source.

5. The phase-loss detection apparatus as claimed in claim 4, wherein the analog-to-digital converter receives the any two line voltages of the three-phase AC power source through the voltage sensing circuit.

6. The phase-loss detection apparatus as claimed in claim 1, wherein the analog-to-digital converter is a Schmitt trigger, and the Schmitt trigger is configured to convert the two line voltages into the first digital signal and the second digital signal.

7. A method of detecting phase loss of a three-phase AC power source, comprising steps of:
    acquiring any two line voltages of the three-phase AC power source with a first cycle period,
    acquiring a first digital signal and a second digital signal respectively corresponding to the two line voltages,
    performing an exclusive OR operation between the first digital signal and the second digital signal to generate a level signal,
    accumulating a high-level time count value when the level signal is maintained in a high level, or accumulating a low-level time count value when the level signal is maintained in a low level,
    resetting the low-level time count value to be zero when the high-level time count value is accumulated, or resetting the high-level time count value to be zero when the low-level time count value is accumulated, and
    determining that the three-phase AC power source occurs a phase-loss abnormality when the high-level time count value is greater than or equal to ⅓ of the first cycle period or the low-level time count value is greater than or equal to ⅙ of the first cycle period.

8. The method of detecting phase loss as claimed in claim 7, wherein when the low-level time count value is greater than or equal to ⅙ of the first cycle period, determining that a common-phase voltage of the any two line voltages occur the phase-loss abnormality.

9. The method of detecting phase loss as claimed in claim 7, wherein when the high-level time count value is greater than or equal to ⅓ of the first cycle period, determining that a non-common-phase voltage of the any two line voltages occur the phase-loss abnormality.

10. The method of detecting phase loss as claimed in claim 7, wherein the level signal has a second cycle period, and the second cycle period is ½ of the first cycle period.

11. The method of detecting phase loss as claimed in claim 10, wherein in the first cycle period, detecting twice whether the high-level time count value is greater than or equal to ⅓ of the first cycle period, and detecting twice whether the low-level time count value is greater than or equal to ⅙ of the first cycle period.

* * * * *